(12) United States Patent
Lee et al.

(10) Patent No.: US 9,576,970 B2
(45) Date of Patent: Feb. 21, 2017

(54) THREE-DIMENSIONAL SEMICONDUCTOR MEMORY DEVICE

(71) Applicant: SK hynix Inc., Incheon-si Gyeonggi-do (KR)

(72) Inventors: Ki Hong Lee, Suwon-si (KR); Seung Ho Pyi, Seongnam-si (KR); Seok Min Jeon, Yeoju-gun Gyeonggi-do (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/474,383

(22) Filed: Sep. 2, 2014

(65) Prior Publication Data

US 2014/0367765 A1    Dec. 18, 2014

Related U.S. Application Data

(62) Division of application No. 13/601,396, filed on Aug. 31, 2012, now Pat. No. 8,853,767.

(30) Foreign Application Priority Data

Jun. 4, 2012   (KR) .................. 10-2012-0059920

(51) Int. Cl.
| | |
|---|---|
| H01L 27/115 | (2006.01) |
| H01L 27/12 | (2006.01) |
| H01L 29/66 | (2006.01) |
| H01L 29/788 | (2006.01) |
| H01L 29/792 | (2006.01) |

(52) U.S. Cl.
CPC ..... *H01L 27/11578* (2013.01); *H01L 27/1158* (2013.01); *H01L 27/11519* (2013.01); *H01L 27/11553* (2013.01); *H01L 27/11565* (2013.01); *H01L 27/11582* (2013.01); *H01L 27/12* (2013.01); *H01L 29/66825* (2013.01); *H01L 29/66833* (2013.01); *H01L 29/7889* (2013.01); *H01L 29/7926* (2013.01)

(58) Field of Classification Search
None
See application file for complete search history.

(56) References Cited

U.S. PATENT DOCUMENTS

| | | | |
|---|---|---|---|
| 8,076,198 B2 | 12/2011 | Lee et al. | |
| 8,178,919 B2 | 5/2012 | Fujiwara et al. | |
| 2010/0059811 A1 | 3/2010 | Sekine et al. | |
| 2010/0244119 A1 | 9/2010 | Fukuzumi et al. | |
| 2011/0291176 A1* | 12/2011 | Lee ................... | H01L 27/11578 257/324 |

(Continued)

FOREIGN PATENT DOCUMENTS

KR    10-2014-0062636 A    5/2014

*Primary Examiner* — Zandra Smith
*Assistant Examiner* — Molly Reida
(74) *Attorney, Agent, or Firm* — William Park & Associates Ltd.

(57) ABSTRACT

A semiconductor device includes a first source layer; at least one of a second source layer, the second source layer formed substantially in the first source layer; a plurality of conductive layers stacked substantially over the first source layer; channel layers that pass through the plurality of conductive layers and couple to the second source layer; and at least one of a third source layer, the third source layer formed substantially in the second source layer, wherein the third source layer passes through the second source layer and is coupled to the first source layer.

14 Claims, 20 Drawing Sheets

(56) References Cited

U.S. PATENT DOCUMENTS

2012/0003831 A1* 1/2012 Kang ................ H01L 27/11551
                                                    438/639
2012/0043673 A1* 2/2012 Chang ............... H01L 27/11551
                                                    257/786
2012/0049267 A1   3/2012 Jung

* cited by examiner

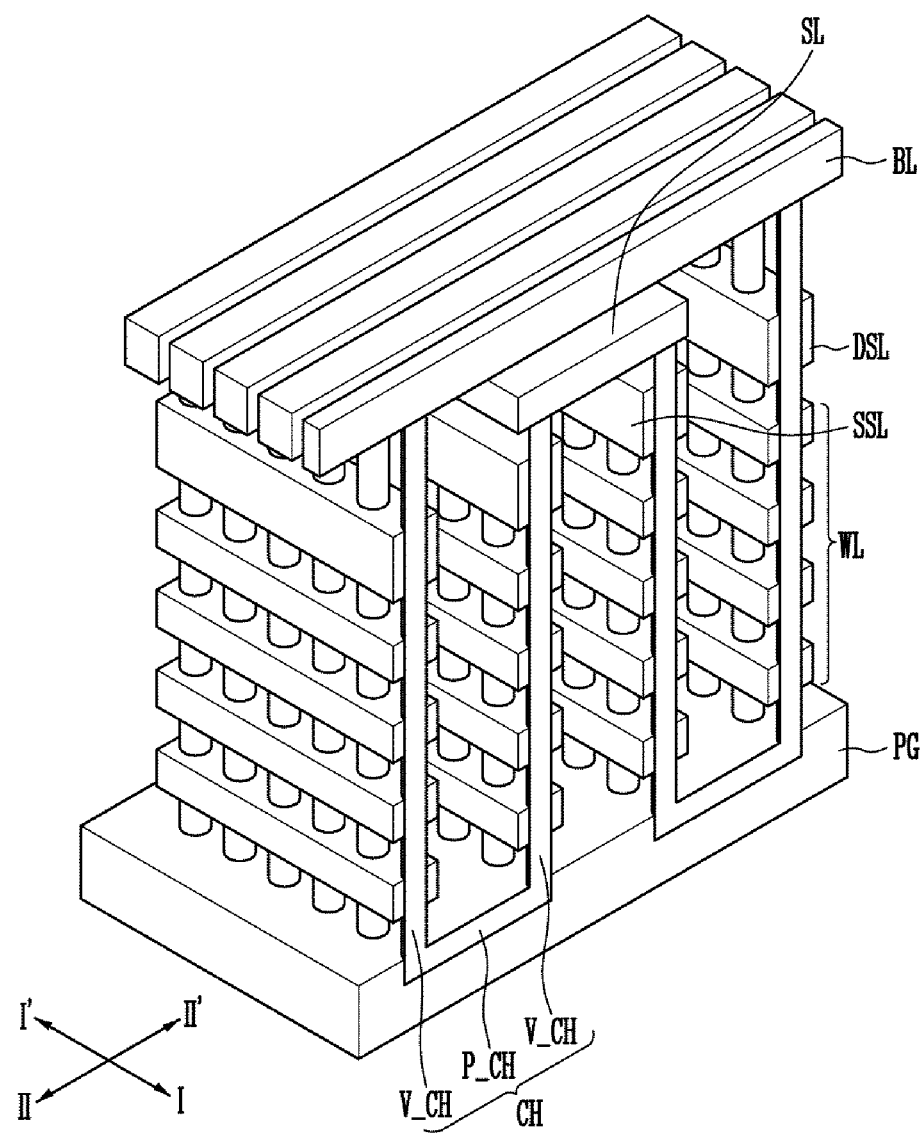

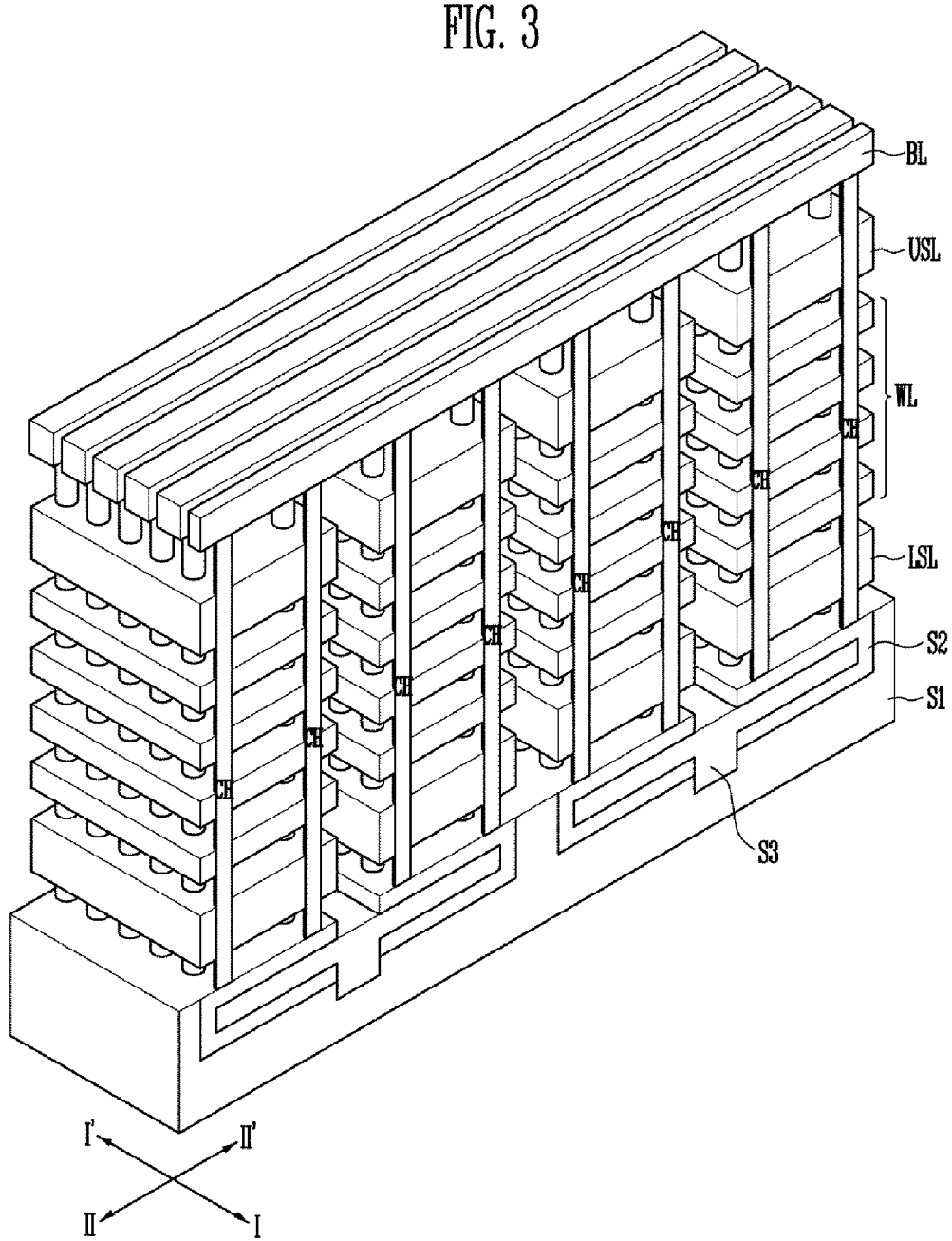

A-A'

A-A'

A-A'

B-B'

C-C'

THREE-DIMENSIONAL SEMICONDUCTOR MEMORY DEVICE

CROSS-REFERENCE TO RELATED APPLICATION

The present application claims priority to Korean patent application number 10-2012-0059920 filed on Jun. 4, 2012, in the Korean Intellectual Property Office, the entire disclosure of which is incorporated by reference herein.

BACKGROUND

1. Technical Field

Various embodiments relate generally to a semiconductor device and a method of manufacturing the same, and to a three-dimensional semiconductor device having a source layer and a method of manufacturing the same.

2. Related Art

A non-volatile memory device can retain data stored therein even in the absence of a power supply. As the degree of integration in creating two-dimensional memory devices that have memory cells fabricated in the form of a single layer on silicon substrates reaches a limit, suggestions of three-dimensional structured non-volatile memory devices that have memory cells vertically stacked on silicon substrates are proposed.

The structure of a known three-dimensional (3-D) non-volatile memory device is described below with reference to FIGS. 1A and 1B.

FIG. 1A is a perspective view of the structure of a conventional 3-D non-volatile memory device. FIG. 1B is a circuit diagram of a single string.

As illustrated in FIG. 1A, the conventional 3-D non-volatile memory device has a plurality of U-shaped channel layers CH each of which comprises a pipe channel layer P_CH formed in a pipe gate PG and first and second vertical channel layers V_CH coupled to the pipe channel layer P_CH. In addition, the conventional 3-D non-volatile memory device may further include word lines WL stacked one upon another and surrounding the first and second vertical channel layers V_CH, source select lines SSL and drain select lines DSL stacked over the word lines WL, a source line SL and bit lines BL.

As illustrated in FIG. 1B, a drain select transistor DST, memory cells MC, a pipe transistor P_Tr and a source select transistor SST form a single string. The string has a U shape. In the related art, since the string has a U shape, the pipe transistor P_Tr is essentially provided to couple source side memory cells MC stacked along the first vertical channel layers V_CH and drain side memory cells MC stacked along the second vertical channel layers V_CH to each other.

However, in addition to the processes of forming memory cells, another process of forming pipe transistors is also needed, thus increasing the number of processes. In addition, it may be difficult to control threshold voltages of these pipe transistors.

FIG. 2A is a perspective view of the structure of a conventional 3-D non-volatile memory device. FIG. 2B is a circuit diagram of a single string.

As illustrated in FIG. 2A, the conventional 3-D non-volatile memory device includes a lower select line LSL, word lines WL, and upper select lines USL that are stacked sequentially over a substrate SUB that includes a source region S. In addition, the conventional 3-D non-volatile memory device may further include vertical channel layers CH, memory layers (not illustrated) and bit lines BL. The vertical channel layers CH may pass through the lower select line LSL, the word lines WL, and the upper select lines USL. The memory layers may surround sidewalls of the vertical channel layers CH. The bit lines BL may be coupled to top surfaces of the vertical channel layers CH.

As illustrated in FIG. 2B, the lower select transistor LST, the memory cells MC, and the upper select transistor UST form a single string. The string may extend vertically.

However, as far as conventional 3-D non-volatile memory devices are concerned, it is not easy to perform the processes associated with the manufacturing of memory layers and vertical channel layers. Specifically, as for a known memory device, after channel holes are formed such that they pass through interlayer insulating layers and conductive layers stacked alternately, a memory layer is formed along inner surfaces of the channel holes. Subsequently, the memory layer formed on the bottom surfaces of the channel holes may be removed to expose the source region S, and the vertical channel layers CH are formed. However, it is difficult to perform the process of etching the memory layer on the bottom surfaces of the channel holes with high aspect ratios. In addition, damage to the memory layer formed along inner walls of the channel holes may occur during the etch process, thus deteriorating characteristics of the memory cells.

BRIEF SUMMARY

An embodiment relates to a semiconductor device that does not have a pipe transistor and allows for easy manufacture, and a method of manufacturing the same.

A semiconductor device according to an embodiment includes a first source layer; at least one of a second source layer, the second source layer formed substantially in the first source layer; a plurality of conductive layers stacked substantially over the first source layer; channel layers that pass through the plurality of conductive layers and couple to the second source layer; and at least one of a third source layer, the third source layer formed substantially in the second source layer, wherein the third source layer passes through the second source layer and is coupled to the first source layer. A semiconductor device according to another embodiment includes an insulating layer; at least one of a first source layer formed substantially in the insulating layer; a plurality of conductive layers stacked substantially over the insulating layer; channel layers that pass through the plurality of conductive layers and couple to the first source layer; and a second source layer formed substantially in the first source layer.

A semiconductor device includes a first conductive layer; a semiconductor layer divided into a horizontal region, in which the semiconductor layer surrounds an outer surface of the first conductive layer, and a vertical region which begins protruding from a top surface of the first conductive layer; a multi-layer insulating layer surrounding an outer surface of the semiconductor layer; and a plurality of second conductive layers surrounding the vertical region of the semiconductor layer and stacked with the multi-layer insulating layer interposed therebetween.

A method of manufacturing a semiconductor device according to an embodiment includes forming a trench by etching a first source layer; forming a sacrificial layer in the trench; forming first material layers and second material layers alternately over the first source layer having the sacrificial layer formed therein; forming channel holes coupled to the trench by etching the first material layers and the second material layers; removing the sacrificial layer exposed on bottom surfaces of the channel holes; forming a semiconductor layer along an inner surface of the trench and inner surfaces of the channel holes; forming a first slit between the channel holes, wherein the first slit extends to the first source layer; forming a second source layer by doping the semiconductor layer, formed in the trench, with impurities through the first slit; and forming a third source layer in the second source layer and a lower portion of the first slit, wherein the third source layer is coupled to the first source layer.

A method of manufacturing a semiconductor device according to another embodiment includes forming a trench by etching an interlayer insulating layer; forming a sacrificial layer in the trench; forming first material layers and second material layers alternately over the interlayer insulating layer having the sacrificial layer formed therein; forming channel holes coupled to the trench by etching the first material layers and the second material layers; removing the sacrificial layer exposed on bottom surfaces of the channel holes; forming a semiconductor layer along an inner surface of the trench and inner surfaces of the channel holes; forming a first slit between the channel holes, wherein the first slit has a depth extending at least to the trench; forming a first source layer by doping the semiconductor layer, formed in the trench, with impurities through the first slit; and forming a second source layer in the first source layer.

BRIEF DESCRIPTION OF THE DRAWINGS

FIGS. 1A and 1B are views of the structure of a conventional three-dimensional (3-D) non-volatile memory device;

FIG. 3 is a perspective view of the structure of a semiconductor device according to an embodiment;

DETAILED DESCRIPTION

Figure 1B:
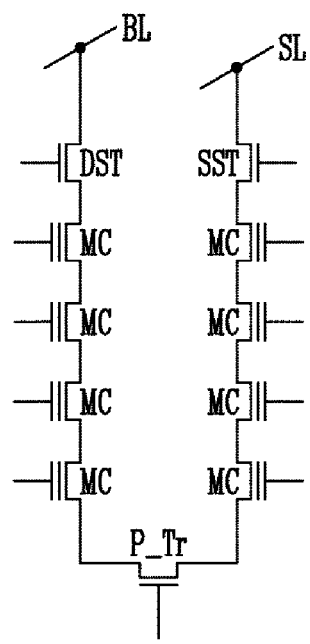
Figure 2A:
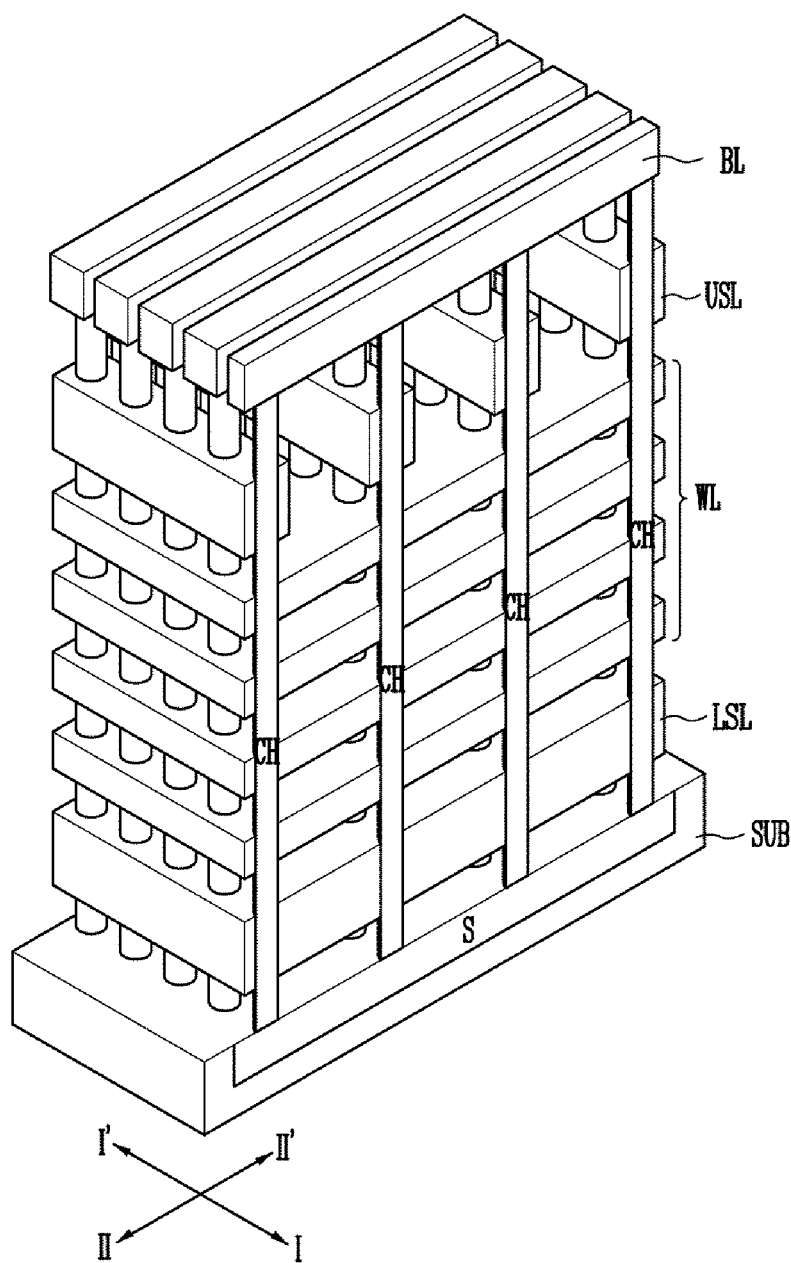
FIGS. 2A and 2B are views of the structure of a conventional (3-D) non-volatile memory device.
Figure 2B:
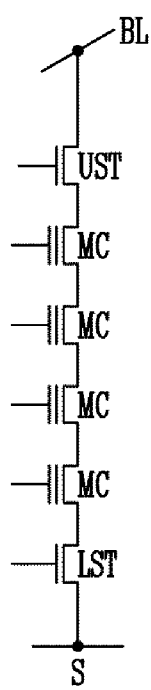

Hereinafter, various embodiments of the present disclosure will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

FIG. 3 is a perspective view of the structure of a semiconductor device according to an embodiment. An insulating layer is not depicted for illustration purposes.

As illustrated in FIG. 3, the semiconductor device according to the embodiment may include a first source layer S1; one or more second source layers S2 formed substantially in the first source layer S1; a plurality of conductive layers formed substantially over the first source layer S1; semiconductor pillars passing through the conductive layers and coupled to the one or more second source layers S2; and a third source layer S3 formed substantially in each second source layer S2, and passing through the second source layer S2 and coupled to the first source layer S1.

In addition, the semiconductor device according to the embodiment may further include memory layers (not illustrated) and bit lines BL. Each of the memory layers may substantially surround outer surfaces of the semiconductor pillars and an outer surface of the second source layer S2. The bit lines BL may be formed substantially over the conductive layers and extend in a second direction II-II'. Each of the bit lines BL may be coupled to the semiconductor pillars that are arranged in the second direction II-II'.

Here, at least one of lowermost conductive layers, from the plurality of conductive layers stacked one upon another, may be used as a lower select line LSL, at least one of uppermost conductive layers may be used as an upper select line USL, and the rest of the conductive layers may be used as word lines WL.

Each of the first to third source layers S1 to S3 may comprise of a polysilicon layer doped with impurities or a metal layer. For example, the first and second source layers S1 and S2 may be formed of polysilicon layers doped with N-type impurities, and the third source layer S3 may comprise of a metal layer formed of tungsten.

The semiconductor pillars may be used as channel layers CH. For example, each of the semiconductor pillars may be formed of a polysilicon layer not doped with impurities. In addition, the semiconductor pillars may be formed integrally with the second source layer S2.

According to the structure of the semiconductor device as described above, strings substantially extend vertically from a substrate. Therefore, pipe transistors may not be provided, which makes it easier to drive the memory device. In addition, as the third source layer S3 comprises a metal layer, and the third source layer S3 is coupled to the first and second source layers S1 and S2, source resistance may be reduced improving the characteristics of the memory device.

Figure 4:
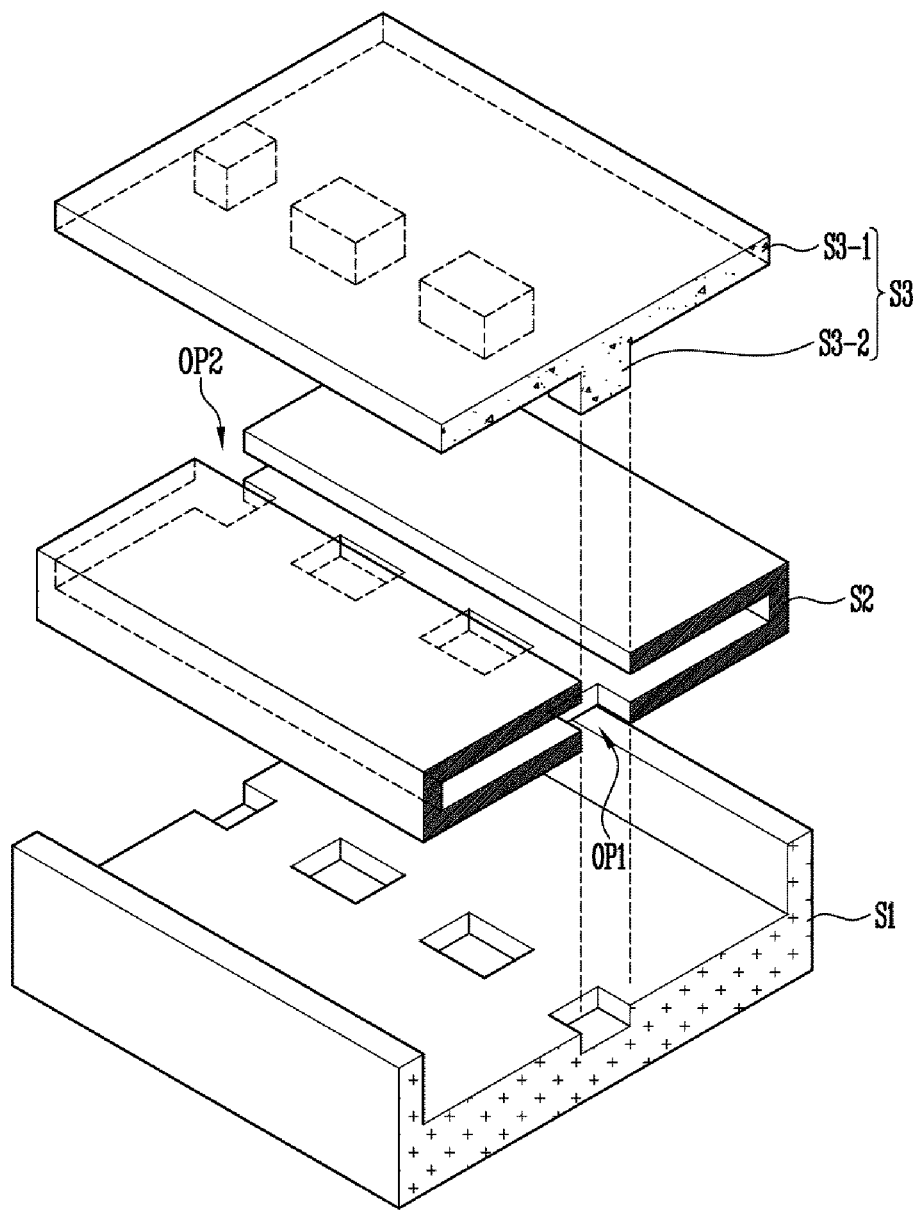
FIGS. 4 and 5 are exploded perspective views of a source layer structure of the semiconductor device according to an embodiment.

FIG. 4 is an exploded perspective view of a source layer structure of the semiconductor device according to an embodiment.

As illustrated in FIG. 4, the second source layer S2 may be formed substantially in the first source layer S1, and the first source layer S1 substantially surrounds the side surfaces and the bottom surface of the second source layer S2. In addition, the third source layer S3 may be formed substantially in the second source layer S2, and the second source layer S2 substantially surrounds a top surface, side surfaces, and the bottom surface of the third source layer S3.

Here, the second source layer S2 may include one or more first openings OP1 that may be formed substantially in the bottom surface thereof and at least one second opening OP2 formed substantially in the top surface thereof. Here, the one or more first openings OP1 may be in the form of islands and may be arranged at regular intervals. The second opening OP2 may be in the form of a line and may overlap with the first openings OP1.

The third source layer S3 may comprise of a plate layer S3-1 and one or more protruding layers S3-2. The plate layer S3-1 may be formed substantially in the second source layer S2. The one or more protruding layers S3-2 may protrude from a bottom surface of the plate layer S3-1. The one or more protruding layers S3-2 may be in the form of islands and be located at positions corresponding to the first openings OP1 of the second source layer S2. Therefore, the protruding layers S3-2 may protrude through the first openings OP1 of the second source layer S2 and be directly coupled to the first source layer S1.

Figure 5:
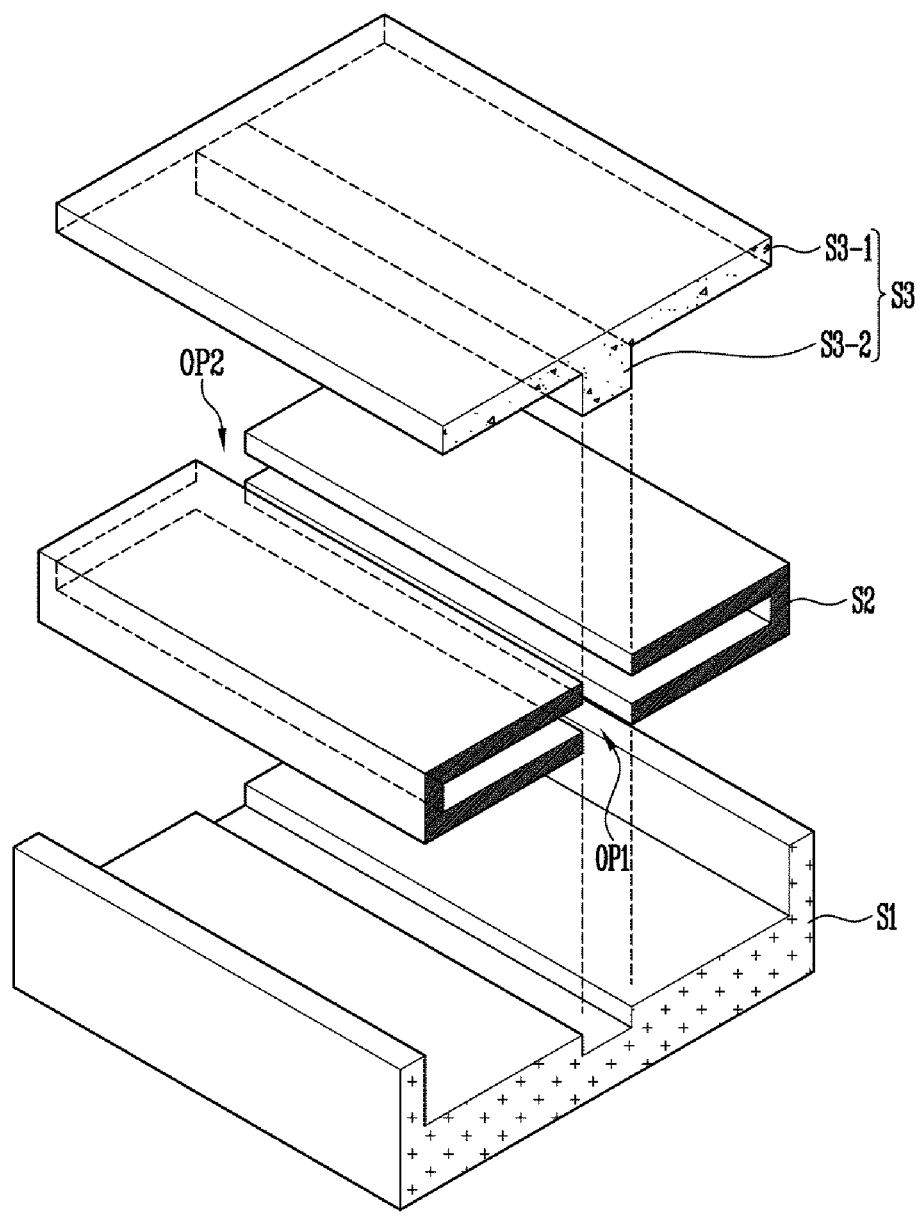

FIG. 5 is an exploded perspective view of a source layer structure of the semiconductor device according to an embodiment.

As illustrated in FIG. 5, the second source layer S2 may be formed substantially in the first source layer S1, and the first source layer S1 substantially surrounds side surfaces and the bottom surface of the second source layer S2. In addition, the third source layer S3 may be formed substantially in the second source layer S2, and the second source layer S2 substantially surrounds a top surface, side surfaces, and a bottom surface of the third source layer S3.

Here, the second source layer S2 may comprise, at least, one first opening OP1 that is formed substantially in the bottom surface thereof and at least one second opening OP2 that may be formed substantially in the top surface thereof. The first opening OP1 may be in the form of a line that substantially crosses the bottom surface of the second source layer S2, and the second opening OP2 may be in the form of a line that substantially crosses the top surface of the second source layer S2. In addition, the first opening OP1 and the second opening OP2 may substantially overlap with each other.

The third source layer S3 may comprise the plate layer S3-1 and at least one protruding layer S3-2. The plate layer S3-1 may be formed substantially in the second source layer S2, and the protruding layer S3-2 may protrude from a bottom surface of the plate layer S3-1. The protruding layer S3-2 may be in the form of a line and may be located at a position corresponding to the first opening OP1 of the second source layer S2. Therefore, the protruding layer S3-2 may protrude through the first opening OP1 of the second source layer S2 and be directly coupled to the first source layer S1.

Figure 8A:
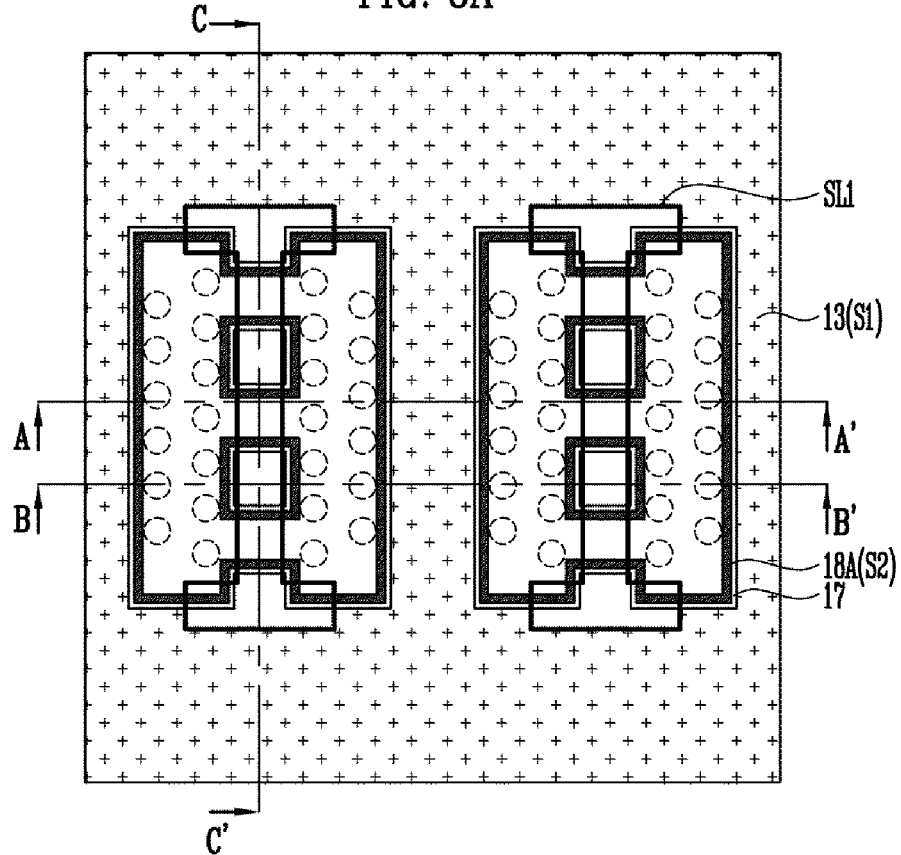
Figure 8B:
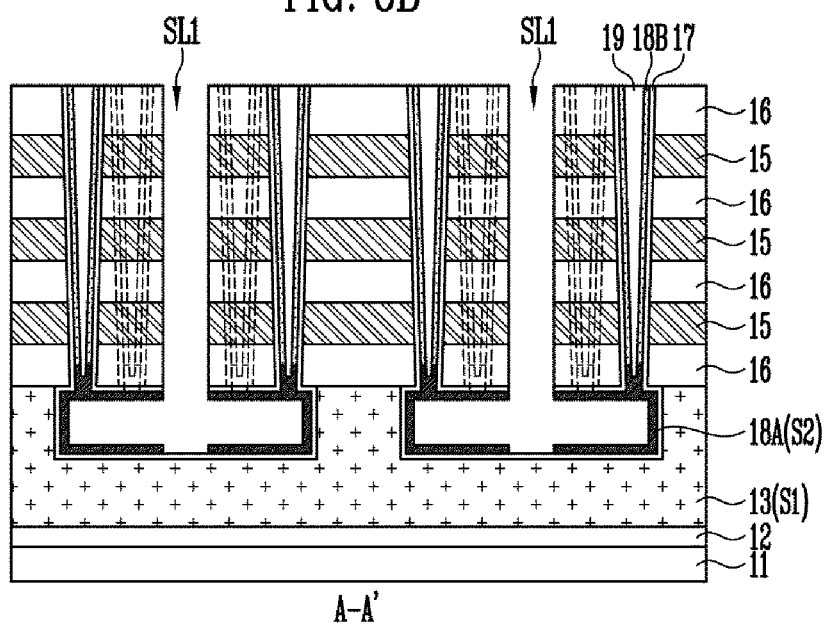
Figure 8C:
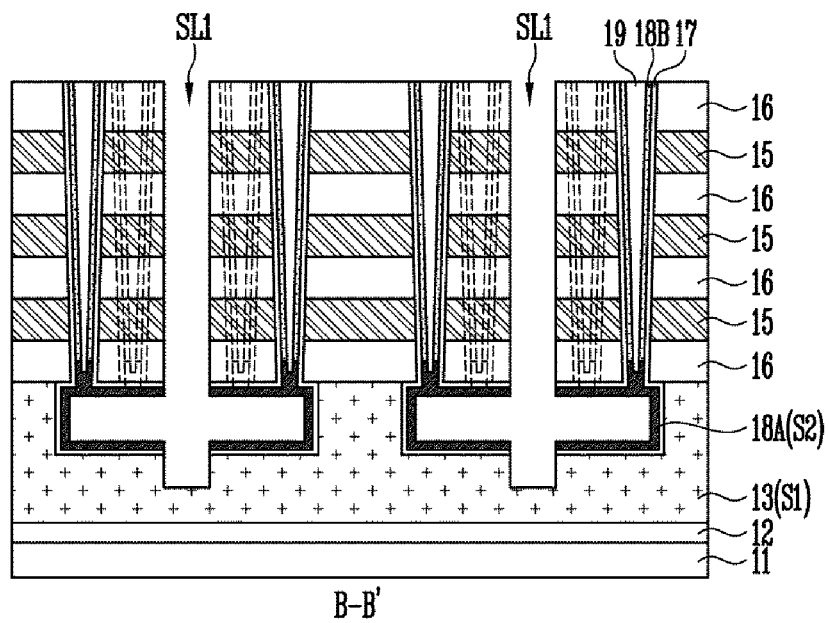
Figure 8D:
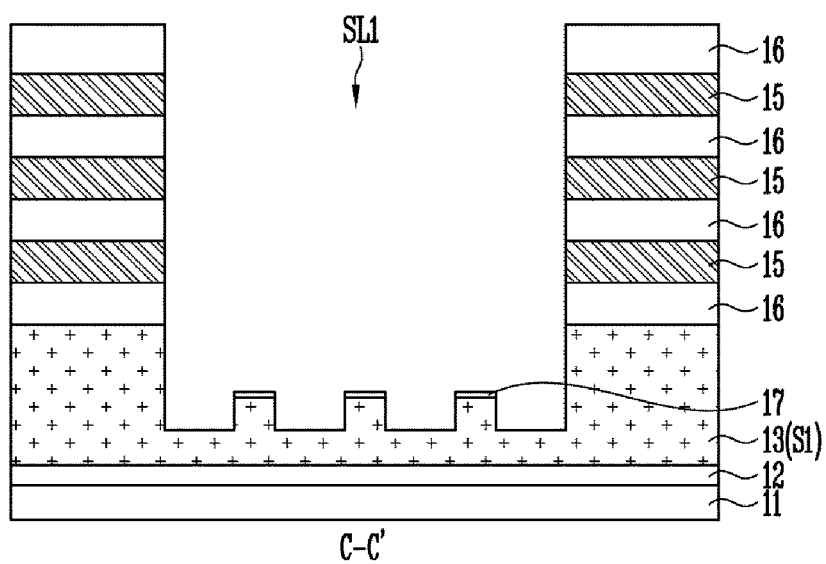
Figure 9A:
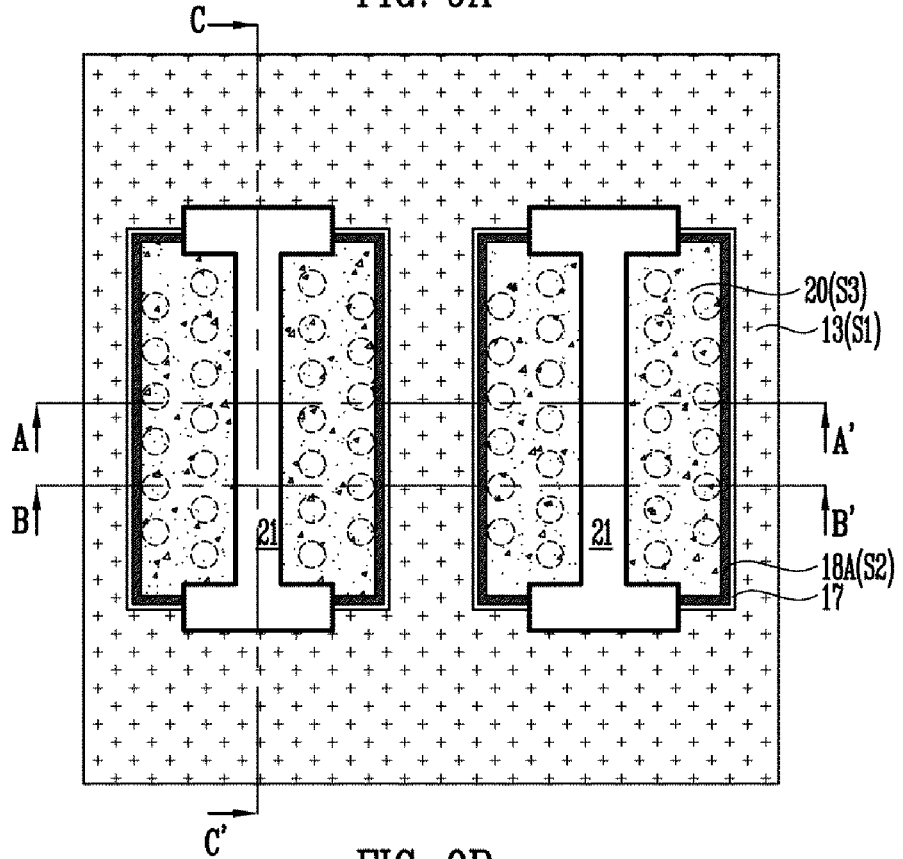
Figure 9B:
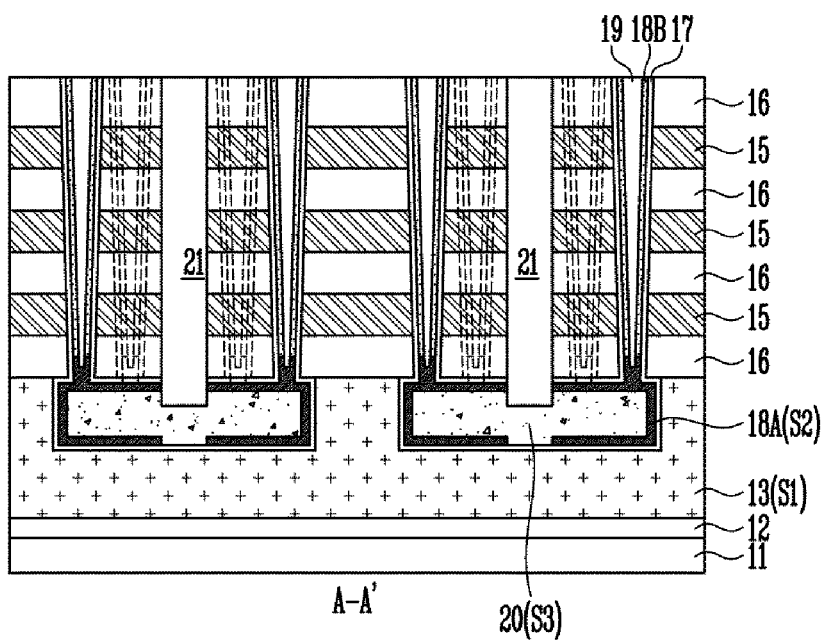
Figure 9C:
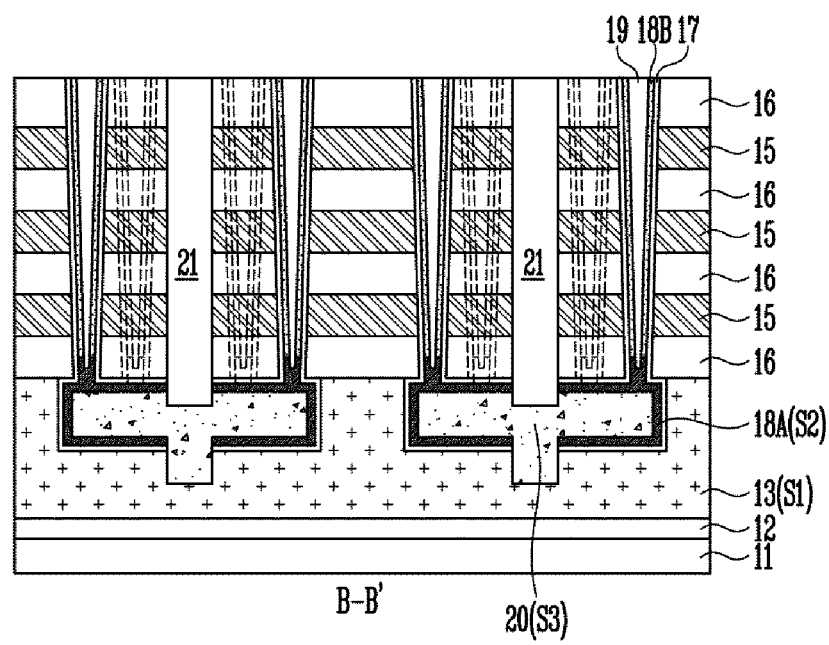
Figure 9D:
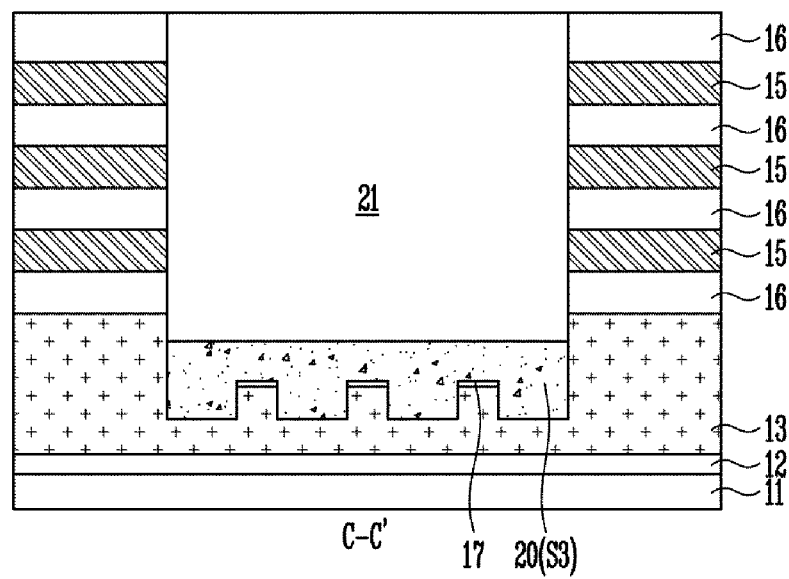

FIGS. 6A and 6B, 7A and 7B, 8A to 8D, 9A to 9D, 10A and 10B, and 11A and 11B are views illustrating a method of manufacturing the semiconductor device according to an embodiment. FIGS. 6A to 11A are layout views, FIGS. 6B to 11B are cross-sectional views taken along line A-A', FIGS. 8C and 9C are cross-sectional views taken along line B-B', and FIGS. 8D and 9D are cross-sectional views taken along line C-C'.

Figure 6A:
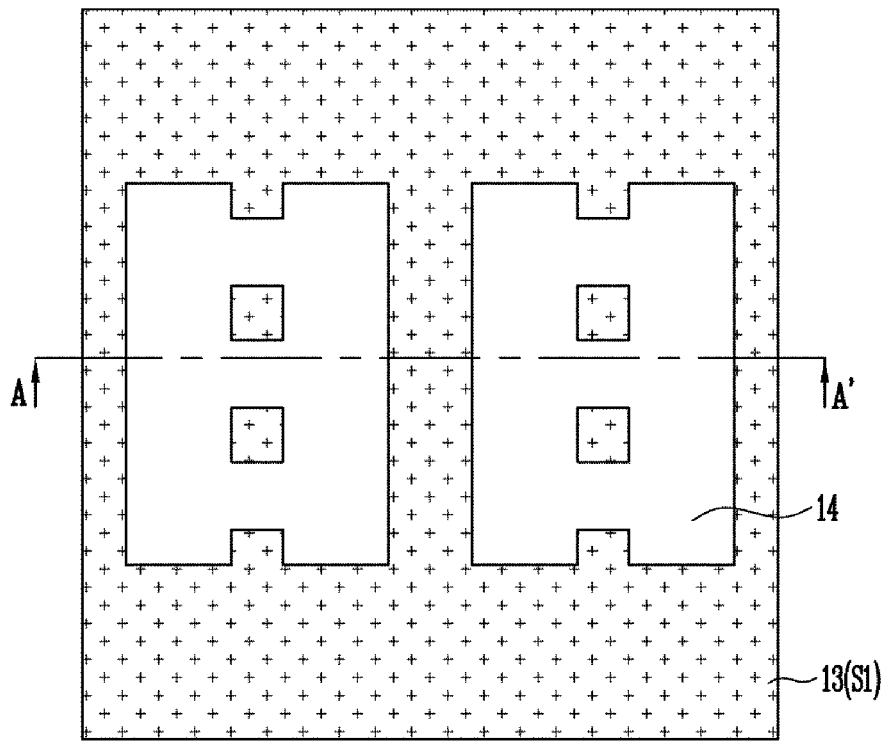
FIGS. 6A and 6B, 7A and 7B, 8A to 8D, 9A to 9D, 10A and 10B, and 11A and 11B are views illustrating a method of manufacturing the semiconductor device according to an embodiment.
Figure 6B:
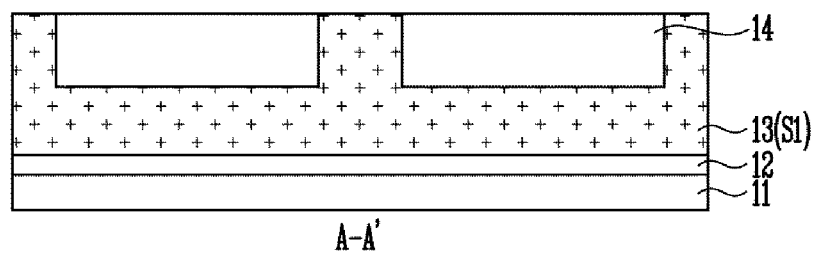

As illustrated in FIGS. 6A and 6B, after an insulating layer 12 is formed substantially over a substrate 11, a first source layer 13(S1) may be formed substantially over the insulating layer 12. The insulating layer 12 may electrically insulate the first source layer 13 from the substrate 11. The insulating layer 12 may comprise an oxide layer. In addition, the first source layer 13 may be a polysilicon layer doped with impurities. In an example, the first source layer 13 may comprise a polysilicon layer doped with N type impurities.

Subsequently, the first source layer 13 may be etched to form trenches. Each of the trenches may define a region in which a second source layer and a third source layer may be formed in subsequent processes. For example, each trench may be in the form of an island, a line, or a combination of an island and a line. In the first embodiment, the trench may be shaped like a ladder consisting of line trenches and island trenches that coupe the line trenches.

Subsequently, sacrificial layers 14 may be formed substantially in the trenches. For example, after the sacrificial layers 14 are formed substantially over the first source layer 13 in which the trenches may be formed, a planarization process may be performed until a surface of the first source layer 13 is exposed. As a result, the sacrificial layer 14 may be formed in each of the trenches. In one example, the sacrificial layer 14 may comprise a nitride layer (SiN) or a titanium nitride layer (TiN).

Figure 7A:
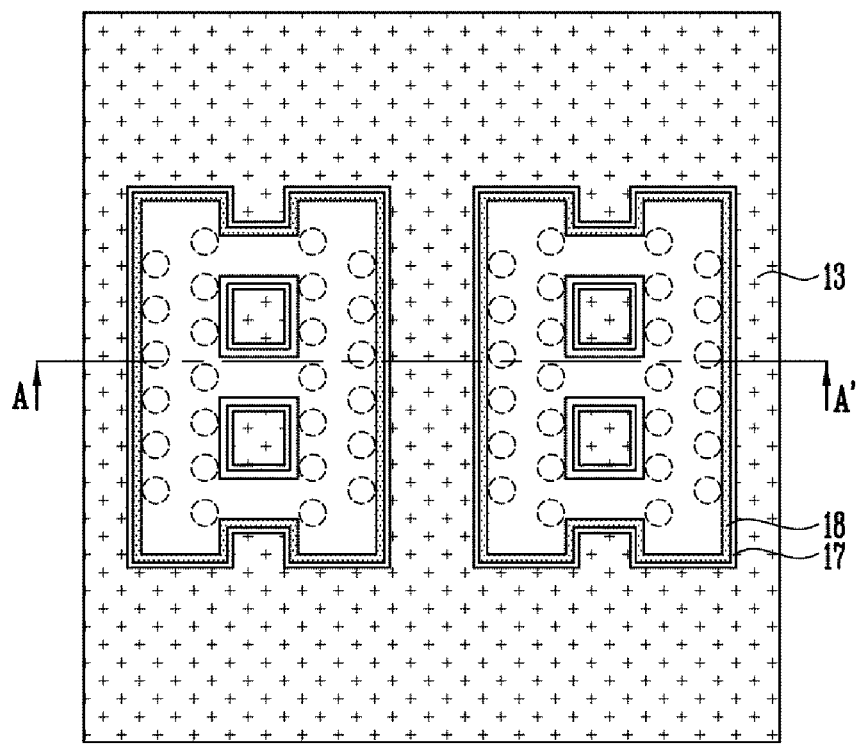
Figure 7B:
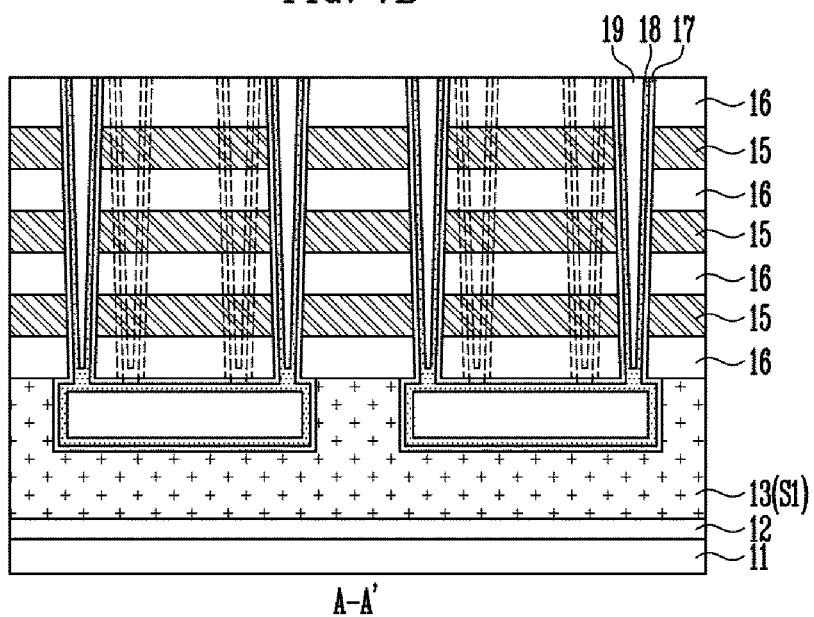

As illustrated in FIGS. 7A and 7B, first material layers 15 and second material layers 16 may be formed alternately over the first source layer 13 or 13(S1) in which the sacrificial layer 14 may be formed. The first material layer 15 may be used to form a conductive layer of a word line, a lower select line, or an upper select line. The second material layer 16 may be used to separate stacked conductive layers from each other. The thickness of the first material layer 15 may vary, depending on its purpose. A conductive layer for an upper select line or a lower select line may have substantially the same thickness as a conductive layer for a word line.

The first material layer 15 and the second material layer 16 may be formed of materials having a high etch selectivity therebetween. In an example, the first material layer 15 may comprise a conductive layer such as a polysilicon layer, and the second material layer 16 may comprise an insulating layer such as an oxide layer. In another example, the first material layer 15 may comprise a conductive layer such as a doped polysilicon layer or a doped amorphous silicon layer, and the second material layer 16 may be formed of a sacrificial layer such as an undoped polysilicon layer or an undoped amorphous silicon layer. In yet another example, the first material layer 15 may comprise a sacrificial layer such as a nitride layer, and the second material layer 16 may comprise an insulating layer such as an oxide layer.

In an embodiment, the first material layer 15 may comprise of a sacrificial layer, and the second material layer 16 may comprise of an insulating layer.

Subsequently, the first material layers 15 and the second material layers 16 may be etched to form channel holes, which may be coupled to each of the trenches. For illustration purposes, positions of channel holes may be indicated by dotted lines in the layout view of FIG. 7A, and channel holes formed behind the cross-section taken along the line A-A' are indicated by dotted lines in the cross-sectional view of FIG. 7B.

Here, the channel holes may taper toward the bottom. The channel holes may be arranged in a matrix or they may alternate with each other. In addition, the channel holes may be divided between both sides of each trench in consideration of a position of a first slit to be formed in subsequent processes. In an example, when the trench may be shaped like a ladder, channel holes may be arranged at positions so that they overlap with the line trench. In another example, when the trench is shaped like an island shape, channel holes may be located at both sides of the trench.

The number of channel holes coupled to each trench may vary depending on an integration degree of the memory device. FIGS. 7A and 7B illustrate that a single trench may be coupled to four channel hole arrays. However, a single trench may be coupled to two, six, eight or ten channel hole arrays.

Subsequently, after the sacrificial layer 14 that is located substantially on the bottom surfaces of the channel holes is removed, a memory layer 17 may be formed substantially along an inner surface of the trench and inner surfaces of the channel holes. The memory layer 17 may be formed to store data and may comprise of a charge blocking layer, a charge trap layer, and a tunnel insulating layer. The charge trap layer may include a nitride layer, nanodots, and a polysilicon layer.

Subsequently, a semiconductor layer 18 may be formed substantially over the memory layer 17. For example, the semiconductor layer 18 may comprise of a polysilicon layer not doped with impurities.

Since the channel holes taper toward the bottom, connecting portions of the trench and the channel holes may be completely sealed before the trench may be entirely filled with the semiconductor layer 18. Therefore, empty space may be formed in the trench. In addition, the channel holes may not be entirely filled with the semiconductor layer 18, and central portions of the channel holes may remain empty. In this case, an insulating layer 19 may be formed substantially at the central portion of the semiconductor layer 18.

As illustrated in FIGS. 8A to 8D, first slits SL1 may pass through each of the trenches. The first slits SL1 may be used to form a second source layer and a third source layer. Each of the first slits SL1 may be formed between the channel holes and extend to the first source layer 13(S1). For example, the first slit SL1 may be located substantially at a central portion of the trench, and an end of the first slit SL1 may be widened to substantially form an I-shape.

In one example, when the trench has a ladder shape, the first slit SL1 may overlap with the island trenches. In addition, after the first material layers 15, the second material layers 16, the memory layer 17, and the semiconductor layer 18 (i.e., 18A(S2) and 18B) are etched, a portion of the first source layer 13 may be etched to a predetermined depth to form the first slit SL1.

Here, the memory layer 17 that may be formed on the bottom surface of each trench may be used as an etch stop layer. As illustrated in FIG. 8B, the first slit SL1 may be formed to a depth that exposes the surface of the memory layer 17 formed on the bottom surface of the island trench (cross-section taken along the line A-A'). As illustrated in FIG. 8C, the first slit SL1 may extend to the first source layer 13(S1) only between the island trenches (cross-section taken along the line B-B'). In addition, as illustrated in FIG. 8D, the first slit SL1 may have unevenness at a bottom surface thereof (cross-section taken along the line C-C').

In another example, in the case where the trench is in the form of an island, after the first material layers 15, the second material layers 16, the memory layer 17, and the semiconductor layer 18 are etched, a portion of the first source layer 13(S1) may be deeply etched to form the first slit SL1. Since the portion of the first source layer 13(S1) may be deeply etched after the memory layer 17 on the bottom surface of the trench is etched, the bottom surface of the first slit SL1 not have unevenness.

Subsequently, the semiconductor layers 18 in the trenches may be doped with impurities to form second source layers 18A(S2). In one example, the semiconductor layer 18 in the trench may be doped with N type impurities through the first slit SL1 by performing a plasma doping process to thus form the second source layer 18A. In another example, an oxide layer doped with impurities may be formed substantially over the semiconductor layer 18, and the impurities included in the oxide layer may be diffused into the semiconductor layer 18 by heat treatment to thus form the second source layer 18A. Subsequently, the oxide layer may be removed therefrom. Therefore, a substantially horizontal region of the semiconductor layer 18 that may be formed in the trench may be used as the second source layer 18A, while a substantially vertical region of the semiconductor layer 18 that passes through the stacked layers, that is, semiconductor pillars 18B may used as channel layers.

For reference, when subsequent processes that involve high temperatures are performed after the second source layer 18A is formed by doping impurities, it may become difficult to control doping concentration because the impurities included in the second source layer 18A may be diffused to another layer. However, according to an embodiment, since the second source layer 18A may be formed by doping impurities after a process of stacking the first and second material layers 15 and 16, respectively, at relatively high temperatures is completed, doping concentration may be easy to control.

As illustrated in FIGS. 9A to 9D, a third source layer 20(S3) may be formed substantially in the second source layer 18A(S2) and Substantially under the first slit SL1 (see FIGS. 8A-8D). For example, a barrier layer may be formed substantially along an inner surface of the first slit SL1 and an inner surface of the trench, in which the second source layer 18A is formed, and a metal layer is formed thereon. Subsequently, the barrier layer and the metal layer may be etched except for where they are formed in the first and second source layers 13 and 18A, respectively, to thus form the third source layer 20. Here, the barrier layer may be any one of a titanium layer (Ti) and a titanium nitride layer (TiN), or a combination thereof, and the metal layer may be a tungsten layer (W). In addition, when the barrier layer and the metal layer are etched, when a tungsten layer, formed under the first slit SL1, in the first source layer 13 is disconnected from a tungsten layer, formed in the trench, in the second source layer 18A, the tungsten layers may be grown by a selective growth process so as to be re-connected.

As described above, when the second source layer 18A, the semiconductor pillars 18B, and the third source layer 20 are formed after the memory layer 17 is formed, the memory layer 17 may substantially surround an outer surface of the second source layer 18A and outer surfaces of the semiconductor pillars 18B. Therefore, unlike the related art, the bottom surfaces of the channel holes are not blocked by the memory layer. Thus, the process of etching the memory layer to expose the source layer may not be performed.

Subsequently the first slit SL1 is substantially filled with an insulating layer 21. Here, the insulating layer 21 may be an oxide layer formed by using High Temperature Oxidation (HTO) or Hugh Density Plasma (HDP) or a flowable oxide layer such as a Spin-On Dielectric SOD (SOD) layer or a polysilazane (PSZ) layer.

Subsequently, though not illustrated in FIGS. 9A to 9D, the first material layers 15 and the second material layers 16 that are stacked in slimming regions may be stepwise patterned. For example, a mask pattern may be formed to substantially cover portions of slimming regions and a cell region, and a process of etching the first material layers 15 and the second material layers 16 may be repeated by gradually reducing the size of the mask pattern, whereby pad portions may be formed at the conductive layers. The pad portions may be coupled to contact plugs by subsequent processes.

Figure 10A:
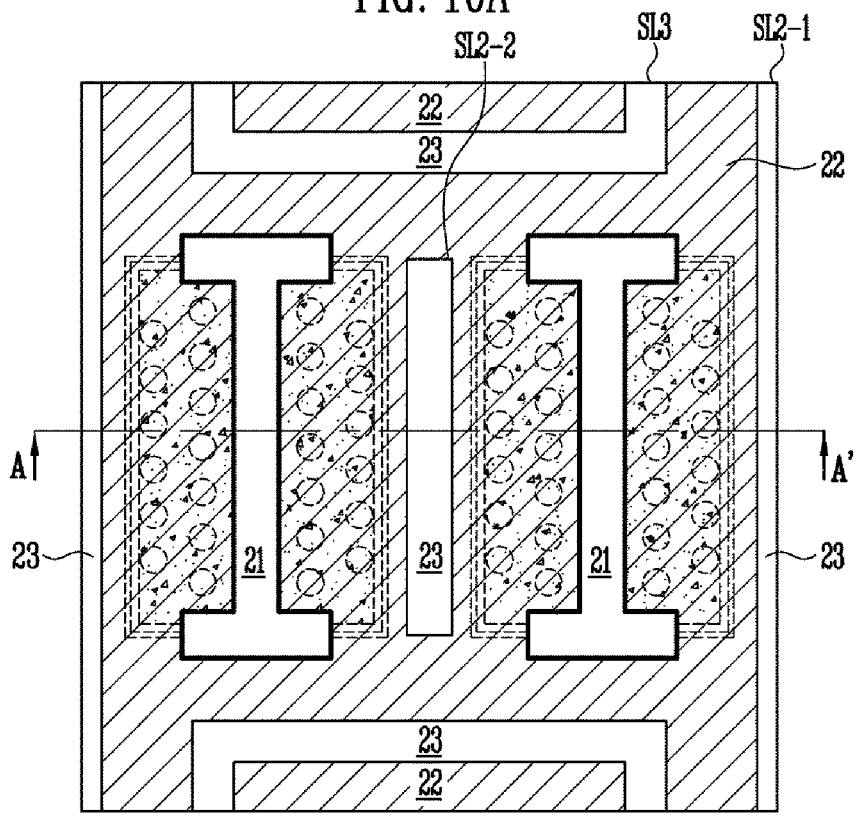
Figure 10B:
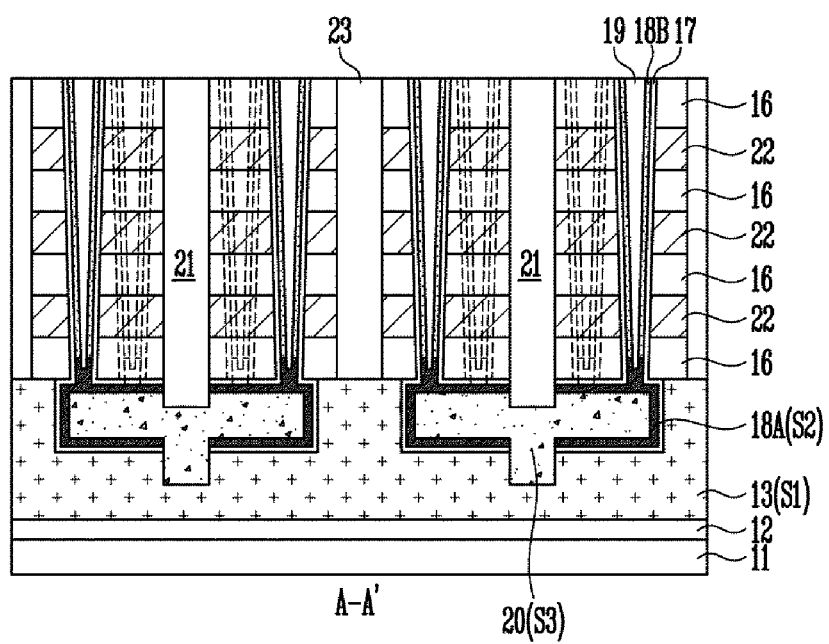

As illustrated in FIGS. 10A and 10B, the first material layers 15 and the second material layers 16 may be etched to form second slits SL2-1 and SL2-2 between the second source layers 18A. For example, the second slits SL2-1 may be formed at interfaces between memory blocks, and the second slits SL2-2 may be formed between the second source layers 18A within a single memory block.

Here, since the second slits SL2-1 formed at interfaces between memory blocks extend to the slimming regions as well as the cell region, each of the second slits SL2-1 may have a length greater than a length of each of the second slits SL2-2 formed substantially between the second source layers 18A. Each of the second slits SL2-2 formed substantially between the second source layers 18A may have a length greater than, smaller than, or equal to the length of each of the first slits SL1. In addition, though not illustrated in FIGS. 10A and 10B, the second slits SL2-1 may have at least one protrusion that protrudes inside the memory block, and an end of each of the second slits SL2-2 formed between the second source layers 18A inside the memory block may be expanded into substantially an I-shape.

One or more thirds slit SL3 may be formed at substantially the same time as the second slits SL2-1 and SL2-2 are formed. The one or more third slits SL3 may be formed substantially in the slimming regions. Here, the third slits SL3 may be formed substantially in or around the slimming regions. In addition, the memory device includes the slimming regions at substantially the top and the bottom with the cell region at the center. The third slits SL3 may be formed substantially in the slimming regions at either or both of the top and bottom. In addition, when the third slits SL3 are formed in slimming regions at the top and bottom, the third slits SL3 may be symmetrical or asymmetrical with respect to each other. In FIGS. 10A and 10B, the third slits SL3 are symmetrically formed around the edges of the slimming regions at the top and bottom.

Subsequently, the first material layers 15 exposed to the second slits SL2-1 and SL2-2 and the third slits SL3 may be etched to form first recessed regions. Conductive layers 22 may be subsequently formed substantially in the first recessed regions. For example, after the conductive layers 22 are deposited to substantially fill the first recessed regions, the conductive layers 22 formed along inner walls of the second slits SL2-1 and SL2-2 may be etched to separate the conductive layers 22 that substantially fill the first recessed regions from each other.

Here, charge blocking layers may be additionally formed in the first recessed regions before the conductive layers 22 are formed. In addition, air gaps may be formed in the first recessed regions by controlling deposition conditions when the conductive layers 22 are formed.

Subsequently, the second slits SL2-1 and SL2-2 and the third slits SL3 may be substantially filled with an insulating layer 23. At this time, air gaps may be formed in the second slits SL2-1 and SL2-2.

Figure 11A:
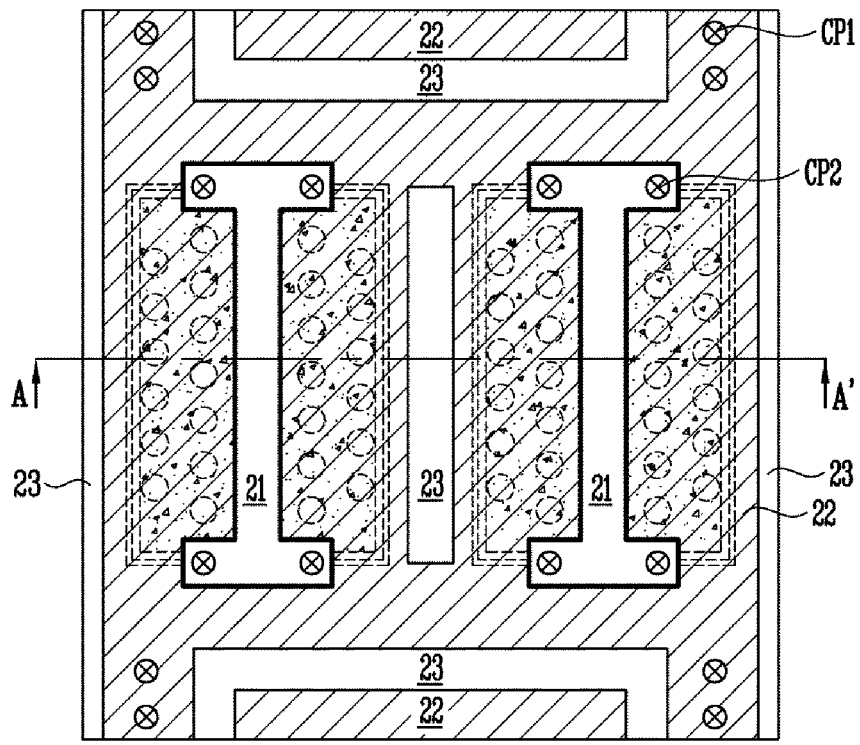
Figure 11B:
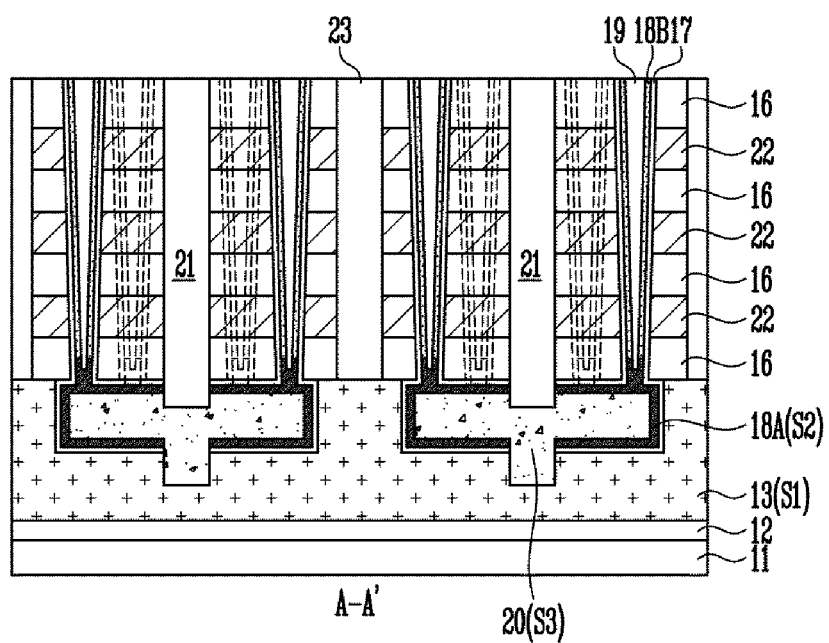

As illustrated in FIGS. 11A and 11B, first contact plugs CP1 may be formed such that the first contact plugs CP1 may be coupled to the conductive layers 22 stacked in the slimming region. In addition, second contact plugs CP2 may be formed such that the second contact plugs CP2 may be coupled to the first source layer 13.

In this manner, the semiconductor device may be formed of the semiconductor pillars 18B coupled to the second source layer 18A(S2) and the first, second, and third source layers 13(S1), 18A(S2), and 20(S3), respectively. As described above, after the memory layer 17 is formed substantially along the inner surface of the trench and the inner surfaces of the channel holes, the second and third source layers 18A(S2) and 20(S3), respectively, and the semiconductor pillars 18B are formed in the memory layer 17. Therefore, an etch process of exposing the source layer on the bottom surfaces of the channel holes may not be performed. Accordingly, manufacturing processes may become easier, and characteristics of the memory device may be improved.

Additionally, various changes may be made to the above-described manufacturing processes, depending on the types of the first material layer 15 and the second material layer 16. In particular, the processes subsequent to the formation of the second slits SL2-1 and SL2-2 may be partly changed.

For example, when the first material layers 15 are formed of conductive layers, and the second material layers 16 are formed of interlayer insulating layers, the first material layers 15 exposed to the second slits SL2-1 and SL2-2 may be silicided after the second slits SL2-1 and SL2-2 are formed. Subsequently, the second slits SL2-1 and SL2-2 may be substantially filled with the insulating layer 23.

In another example, when the first material layers 15 are formed of conductive layers, and the second material layers 16 are formed of sacrificial layers, the second material layers 16 exposed to the second slits SL2-1 and SL2-2 may be selectively etched to form second recessed regions. Subsequently, the first material layers 15 exposed to the second slits SL2-1 and SL2-2 may be silicided, and the second recessed regions and the second slits SL2-1 and SL2-2 may be substantially filled with the insulating layer 23.

Figure 12:
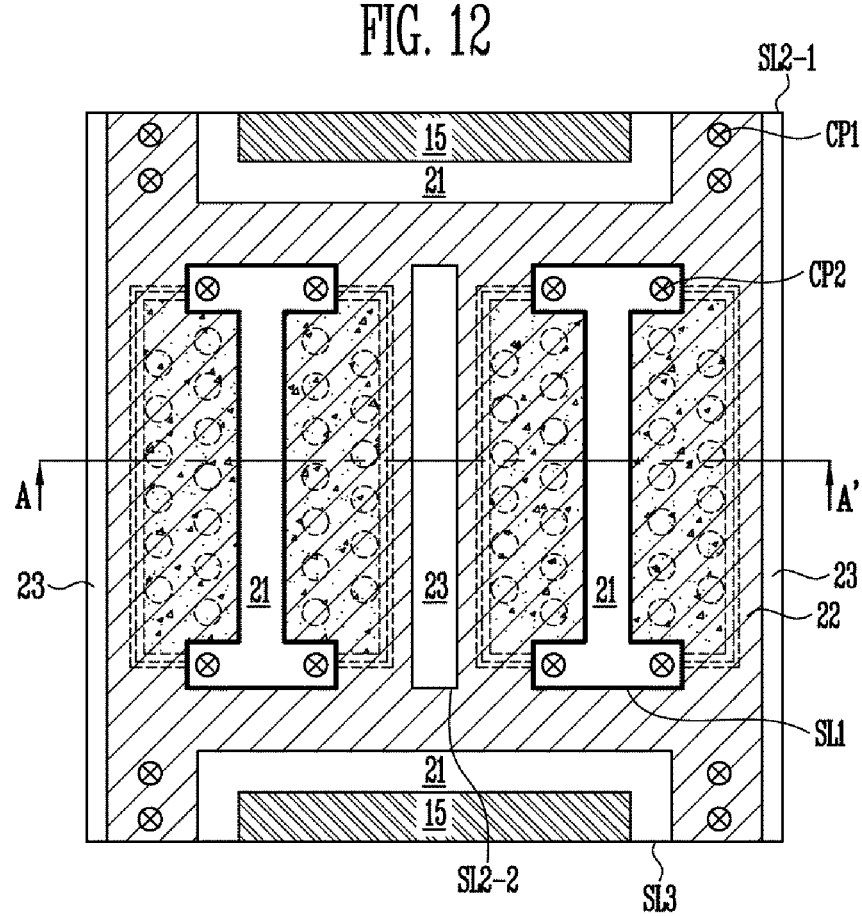
FIG. 12 is a layout view of a semiconductor device according to an embodiment.

FIG. 12 is a layout view of a semiconductor device according to another embodiment. Here, a description of the contents of the embodiment, overlapping with those of the prior embodiment, is omitted.

As illustrated in FIG. 12, the semiconductor device according to the second embodiment may include at least one of a third slit SL3 that may be substantially located in the slimming regions. The third slit SL3 may be formed at substantially the same time as the first slits SL1 are formed. In this example, the second slits SL2-1 and SL2-2 may be formed after the third slit SL3 is substantially filled with the insulating layer 21. The insulating layer 21 substantially filling the third slit SL3 may serve as a support during the process of forming the first recessed regions. Therefore, the insulating layer 21 may prevent the remaining second material layers 16 from collapsing during the process of forming the first recessed regions. In addition, the first material layers 15, substantially surrounded by the third slit SL3, in the slimming region may not be etched, but may remain.

Figure 13:
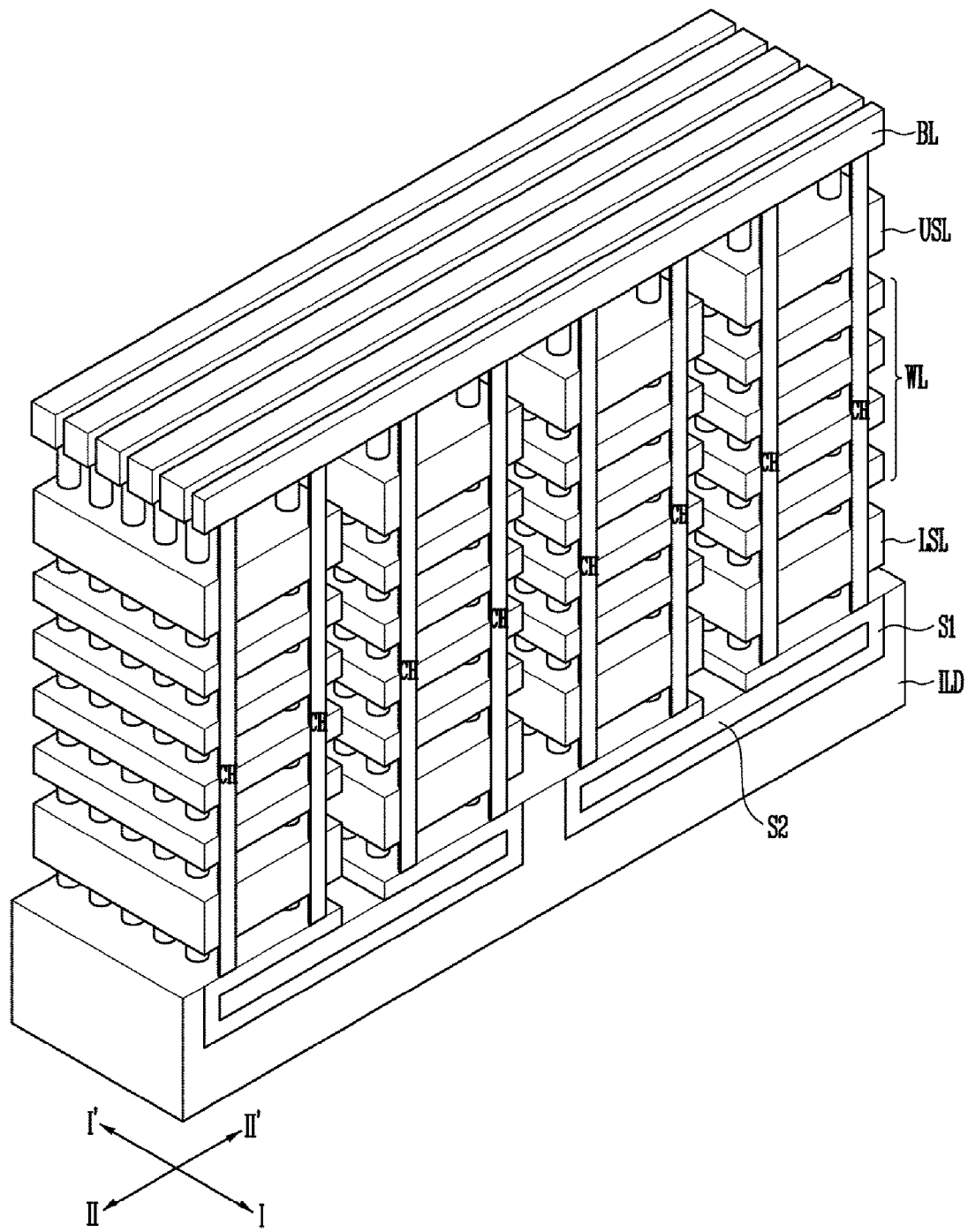
FIG. 13 is a perspective view of the structure of a semiconductor device according to an embodiment.

FIG. 13 is a perspective view of the structure of a semiconductor device according to another embodiment. Here, a description of the contents of this embodiment, overlaps with those of the prior embodiments, and is thus omitted.

As illustrated in FIG. 13, the semiconductor device according to this embodiment may include an interlayer insulating layer ILD, one or more first source layers S1 formed substantially in the interlayer insulating layer ILD, a plurality of conductive layers stacked substantially over the interlayer insulating layer ILD, semiconductor pillars passing through the conductive layers and coupled to the one or more the first source layers S1, and a second source layer S2 formed substantially in each of the first source layers S1. In addition, the semiconductor device may further include memory layers (not illustrated) and bit lines BL. Each of the memory layers (not illustrated) may substantially surround an outer surface of the first source layer S1 and outer surfaces of the semiconductor pillars. The bit lines BL may be formed substantially over the conductive layers and extend substantially in the second direction II-II'.

The semiconductor pillars may be used as the channel layers CH, and the conductive layers may be used as the lower select line LSL, the word lines WL, and the upper select line USL.

In addition, the first source layer S1 may be formed by doping the semiconductor layer with impurities, and the second source layer S2 may be formed of a metal layer. In this case, source resistance may be reduced to improve characteristics of the memory device.

In FIG. 13, the first source layer S1 may completely surround the bottom surface of each second source layer S2. However, a portion of the bottom surface of the second source layer S2 may protrude and pass through the first source layer S1.

Figure 14:
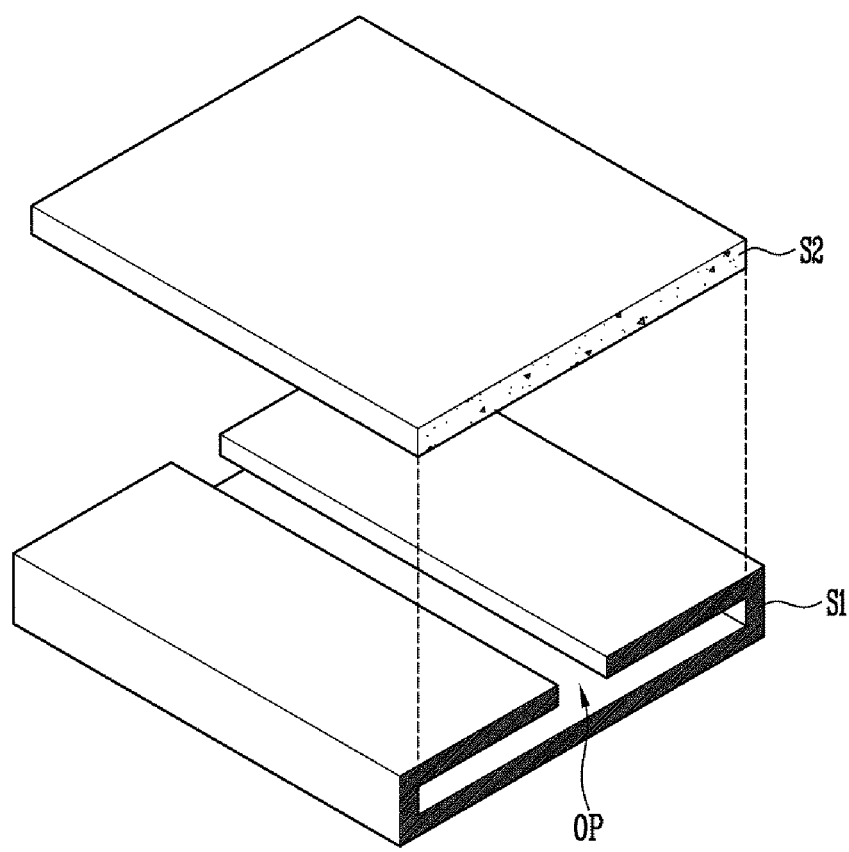
FIG. 14 is an exploded perspective view of a source layer structure of the semiconductor device according to an embodiment.

FIG. 14 is an exploded perspective view of a source layer structure of the semiconductor device according to the above embodiment.

As illustrated in FIG. 14, the second source layer S2 may be formed substantially in the first source layer S1, and the first source layer S1 substantially surrounds a top surface, a side surfaces, and a bottom surface of the second source layer S2. Here, the first source layer S1 may include at least one opening OP that may be formed substantially in the top surface thereof. The opening OP may be substantially in the form of a line.

In addition, though not illustrated in FIG. 14, the first source layer S1 may further include at least one opening that may be formed substantially in the bottom surface thereof. In this case, the second source layer S2 may have a protrusion on the bottom surface thereof, and the protrusion may substantially protrude through the opening OP.

Figure 15A:
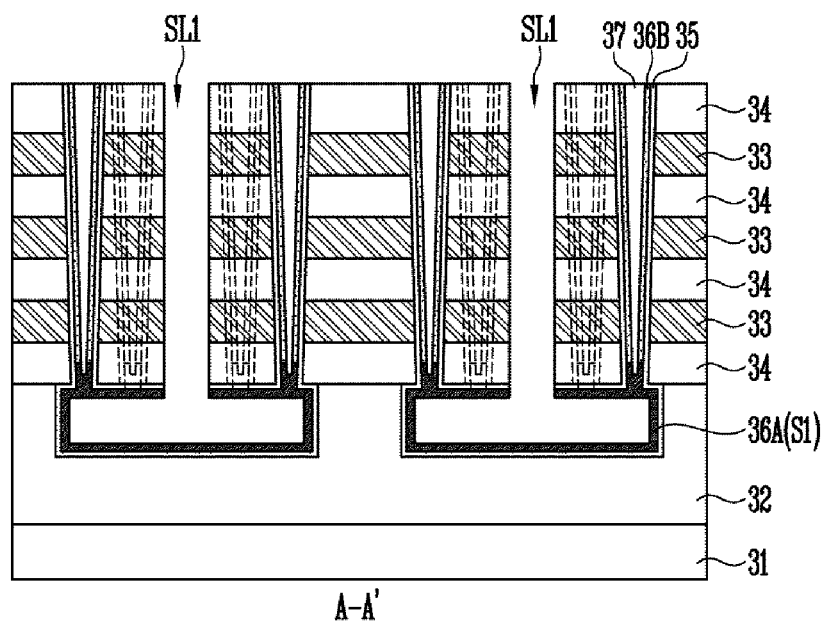
FIGS. 15A and 15B are cross-sectional views illustrating a method of manufacturing the semiconductor device according to an embodiment.
Figure 15B:
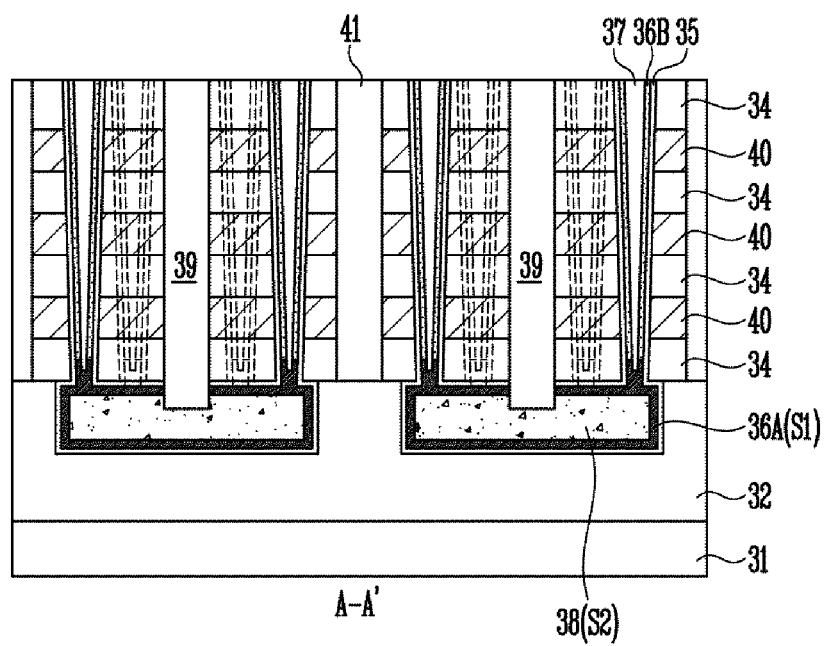

FIGS. 15A and 15B are cross-sectional views illustrating a method of manufacturing the semiconductor device according to the above embodiment. Here, a description of the contents of the above embodiment, overlapping with those of the other embodiments, is omitted.

As illustrated in FIG. 15A, after an interlayer insulating layer 32 is formed substantially over a substrate 31, the interlayer insulating layer 32 may be etched to form trenches. Subsequently, a sacrificial layer (not illustrated) may be formed substantially in each of the trenches.

Subsequently, first material layers 33 and second material layers 34 may be formed alternately substantially over the interlayer insulating layer 32 in which the sacrificial layer may be formed. The first material layers 33 may be used to form conductive layers of word lines, a lower select line, and an upper select line. The second material layers 34 may be used to separate the stacked conductive layers from each other. In an embodiment, the first material layers 33 may comprise sacrificial layers, and the second material layers 34 may comprise insulating layers.

Subsequently, the first material layers 33 and the second material layers 34 may be etched to form channel holes, which may be coupled to the trench. Subsequently, after the sacrificial layer formed substantially on the bottom surfaces of the channel holes are removed, a memory layer 35 may be formed substantially along inner surfaces of the channel holes and an inner surface of the trench. Subsequently, after a semiconductor layer is formed substantially over the memory layer 35, an insulating layer 37 may be formed substantially at open central regions in the channel holes.

Subsequently, the first slits SL1 may be formed substantially between the channel holes such that the first slits SL1 may extend to the trench. Here, the memory layer 35 and the semiconductor layer formed substantially on the bottom surface of the trench may be used as an etch stop layer. Alternatively, the first slits SL1 may extend to the interlayer insulating layer 32.

Subsequently, the semiconductor layers in the trenches may be doped with impurities to form first source layers 36A(S1). Here, semiconductor pillars 36B, not doped with impurities, may be used as channel layers.

As illustrated in FIG. 15B, second source layers 38(S2) may be formed substantially in the first source layers 36A (S1). When the first slits SL1 extend to the interlayer insulating layer 32, the second source layer 38 may substantially fill a lower portion of each of the first slits SL1. Subsequently, each first slit SL1 may be substantially filled with an insulating layer 39.

Subsequently, second slits may be formed between the first source layers 36A by etching the first material layers 33 and the second material layers 34. Subsequently, the first material layers 33 exposed in the second slits may be etched to form first recessed regions. Conductive layers 40 may be subsequently formed substantially in the first recessed regions. The second slits may be substantially filled with an insulating layer 41.

Subsequently, though not illustrated in FIG. 15B, first contact plugs may be formed substantially at slimming regions such that the first contact plugs may be coupled to the conductive layers 40. In addition, second contact plugs may be formed such that the second contact plugs may be coupled to the second source layers 38(S2).

Figure 16:
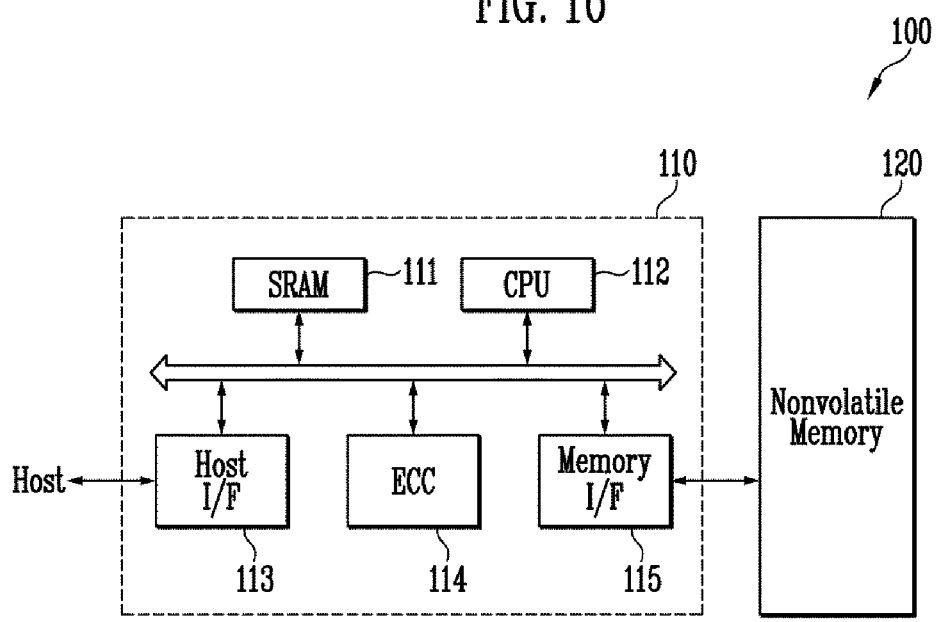
FIG. 16 is a view illustrating the configuration of a memory system according to an embodiment.

FIG. 16 is a view illustrating the configuration of a memory system according to an embodiment.

As illustrated in FIG. 16, a memory system 100 according to an embodiment includes a non-volatile memory device 120 and a memory controller 110.

The non-volatile memory device 120 may have a structure in accordance with the layout as described above. In addition, the non-volatile memory device 120 may be a multi-chip package including a plurality of flagship memory chips.

The memory controller 110 may be configured to control the non-volatile memory device 120 and may include an SRAM 111, a Central Processing Unit (CPU) 112, a host interface (I/F) 113, an ECC circuit 114 and a memory I/F 115. The SRAM 111 may be used as an operating memory of the CPU 112. The CPU 112 may perform an overall control operation for the data exchange of the memory controller 110. The host I/F 113 may include a data exchange protocol of a host that may be coupled to the memory system 100. Furthermore, the ECC circuit 114 may detect and correct errors included in data read out from the non-volatile memory device 120. The memory I/F 115 may interface the memory controller 110 with the non-volatile memory device 120. The memory controller 110 may further include RCM for storing code data for an interface with the host (i.e., Host).

The memory system 100 constructed as above may be a memory card or a Solid State Disk (SSD) in which the non-volatile memory device 120 and the controller 110 may be combined. For example, if the memory system 100 is an SSD, the memory controller 110 may communicate with the outside (e.g., a host) through one of various interface protocols, such as USB, MMC, PCI-E, SATA, PATA, SCSI, ESDI, and IDE, etc.

Figure 17:
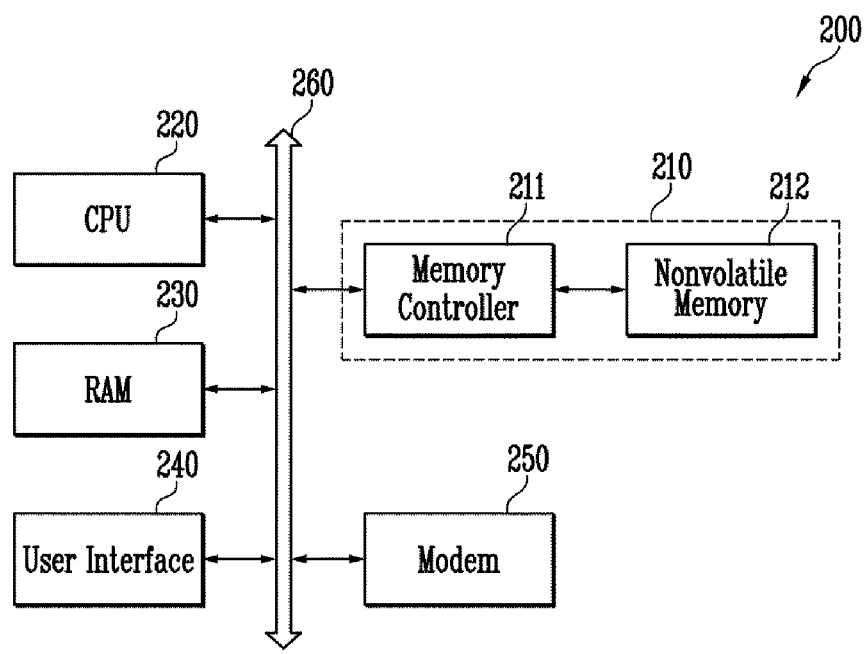
FIG. 17 is a view illustrating the configuration of a computing system according to an embodiment.

FIG. 17 is a view illustrating the configuration of a computing system according to an embodiment.

As illustrated in FIG. 17, the computing system 200 may include a CPU 220, RAM 230, a user interface 240, a modem 250, and a memory system 210 that may be electrically coupled to a system bus 260. If the computing system 200 is a mobile device, the computing system 200 may further include a battery for supplying an operating voltage to the computing system 200. The computing system 200 may further include application chipsets, a Camera Image Processor (CIS), mobile DRAM, and so on.

The memory system 210 may include a non-volatile memory device 212 and a memory controller 211 as described above in connection with FIG. 7.

The present invention provides a three-dimensional semiconductor device that does not have a pipe transistor. In addition, since a memory surface on bottom surfaces of channel holes are not etched, processes of manufacturing a semiconductor device may become easier, and deterioration of memory cell characteristics caused by damage to the memory layer may be prevented.

What is claimed is:

1. A semiconductor device, comprising:
   an insulating layer;
   a plurality of first source layers formed substantially in the insulating layer and insulated from each other by the insulating layer;
   a plurality of conductive layers stacked substantially over the insulating layer;
   channel layers that pass through the plurality of conductive layers and couple to the first source layer; and
   second source layers formed substantially in the plurality of first source layers, respectively.

2. The semiconductor device of claim 1, wherein at least one of a lowermost conductive layer, from the conductive layers, is configured as a lower select line, at least one of an uppermost conductive layer, is configured as an upper select line, and remaining conductive layers are configured as word lines.

3. The semiconductor device of claim 1, further comprising a plurality of memory layers substantially surrounding outer surfaces of the channel layers and an outer surface of the first source layers.

4. The semiconductor device of claim 1, further comprising:
   a plurality of first slits located between the channel layers adjacent to each other, wherein the first slits pass through the conductive layers and extends to the first source layers.

5. The semiconductor device of claim 1, further comprising:
   a plurality of first slits located between the channel layers adjacent to each other, wherein the first slits pass through the conductive layers, the first source layers, and extend through the insulating layer, and the second source layers substantially fill lower portions of the first slits.

6. The semiconductor device of claim 1, further comprising:
   a plurality of second slits located between the first source layers adjacent to each other, wherein each of the second slits has a depth extending through the conductive layers.

7. The semiconductor device of claim 1, wherein the first source layers substantially surround the second source layers, respectively.

8. The semiconductor device of claim 1, further comprising:
   a plurality of first contact plugs coupled to the conductive layers; and
   a plurality of second contact plug coupled to the second source layers.

9. The semiconductor device of claim 1, wherein the second source layers are insulated from each other by the insulating layer.

10. A semiconductor device, comprising:
    a first conductive layer;
    a semiconductor layer divided into a horizontal region, in which the semiconductor layer surrounds an outer surface of the first conductive layer, and a vertical region which begins protruding from a top surface of the first conductive layer;
    a multi-layer insulating layer surrounding an outer surface of the semiconductor layer; and
    a plurality of second conductive layers surrounding the vertical region of the semiconductor layer and stacked with the multi-layer insulating layer interposed therebetween,
    wherein the first conductive layer and the horizontal region of the semiconductor layer are configured as source layers.

11. The semiconductor device of claim 10, wherein the horizontal region of the semiconductor layer is doped with impurities.

12. The semiconductor device of claim 10, further comprising an interlayer insulating layer substantially surrounding the first conductive layer with the multi-layer insulating layer interposed therebetween.

13. The semiconductor device of claim 10, wherein the vertical region of the semiconductor layer is configured as a channel layer, and the second conductive layers are configured as word lines or select lines, and the multi-layer insulating layer is configured as a memory layer.

14. A semiconductor device, comprising:
    an insulating layer;
    at least one first source layer formed in the insulating layer;
    a plurality of conductive layers stacked over the insulating layer;
    channel layers passing through the plurality of conductive layers and coupled to the first source layer;
    a second source layer formed in the first source layer; and
    at least one contact plug coupled to the second source layer.

* * * * *